US008531322B2

(12) United States Patent
Cao et al.

(10) Patent No.: US 8,531,322 B2
(45) Date of Patent: Sep. 10, 2013

(54) TIME-TO-DIGITAL CONVERTER

(75) Inventors: Changhua Cao, Austin, TX (US); Xiaochuan Guo, Austin, TX (US); Yen-Horng Chen, Hsinchu (TW); Caiyi Wang, Austin, TX (US)

(73) Assignee: Mediatek Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/450,263

(22) Filed: Apr. 18, 2012

(65) Prior Publication Data

US 2012/0319883 A1 Dec. 20, 2012

Related U.S. Application Data

(60) Provisional application No. 61/497,429, filed on Jun. 15, 2011.

(51) Int. Cl.
*H03M 1/48* (2006.01)

(52) U.S. Cl.
USPC ........... 341/111; 714/718; 714/719; 714/724; 714/735; 714/700; 324/613; 324/622; 324/160; 375/219; 375/316; 331/34; 327/292; 341/144

(58) Field of Classification Search
USPC ......... 324/613, 622, 160; 327/292; 375/219, 375/316; 331/34; 714/718, 719, 724, 735, 714/736, 700; 341/111–144
See application file for complete search history.

(56) References Cited

U.S. PATENT DOCUMENTS

| | | | | |
|---|---|---|---|---|
| 5,581,204 | A * | 12/1996 | Olsen | 327/31 |
| 6,697,974 | B2 * | 2/2004 | Craft | 714/700 |
| 6,833,725 | B2 * | 12/2004 | Ohkawa et al. | 324/750.3 |
| 7,797,593 | B2 * | 9/2010 | Hsu et al. | 714/718 |
| 8,116,162 | B1 * | 2/2012 | Wennekamp et al. | 365/222 |
| 8,154,307 | B2 * | 4/2012 | Cathelin et al. | 324/613 |

OTHER PUBLICATIONS

Matsumoto, A., et al.; "A Design Method and Developments of a Low-Power and High-Resolution Multiphase Generation System;" IEEE Journal of Solid-State Circuits; vol. 43; No. 4; Apr. 2008; pp. 831-843.

Straayer, M.Z., et al.; "A Multi-Path Gated Ring Oscillator TDC With First-Order Noise Shaping;" IEEE Journal of Solid-State Circuits; vol. 44; No. 4; Apr. 2009; pp. 1089-1098.

Maneatis, J.G., et al.; "Precise Delay Generation Using Coupled Oscillators;" IEEE Journal of Solid-State Circuits; vol. 28; No. 12; Dec. 1993; pp. 1273-1282.

* cited by examiner

*Primary Examiner* — Lam T Mai
(74) *Attorney, Agent, or Firm* — McClure, Qualey & Rodack, LLP

(57) ABSTRACT

Embodiments of a time-to-digital converter are provided, comprising a delay stage matrix and a measurement circuit. The delay stage matrix comprises a first and a second delay lines coupled thereto, and is arranged to propagate a transition signal from a starting delay stage in the first and a second delay lines, wherein each of the first and second delay lines comprises a same number of delay stages coupled in series, each delay stage in one of the first and second delay lines is coupled to a corresponding delay stage in the other delay line and operative to generate a delayed signal. The measurement circuit is arranged to determine a time of the transition signal propagating along the delay stages by sampling the delayed signals using a measurement signal to generate and hold a digital representation of the time.

20 Claims, 8 Drawing Sheets

TIME-TO-DIGITAL CONVERTER

CROSS REFERENCE TO RELATED APPLICATIONS

This Application claims priority of U.S. Provisional Application No. 61/497,429, filed on Jun. 15, 2011, and the entirety of which is incorporated by reference herein.

BACKGROUND OF THE INVENTION

1. Field of the Invention

The present invention relates to analog/digital mixed mode signal circuitry, and in particular relates to a time-to-digital converter realized by a coupled ring oscillator.

2. Description of the Related Art

A time-to-digital converter (TDC) quantifies time information of a signal event with respect to a reference event. The TDCs have been used in applications in digital phase lock loops (PLLs), physics and laser range finding. The performance of the TDC is characterized by a digital resolution for representing the time information. The TDC is typically implemented by a delay line that comprises a number of delay elements for generating corresponding equally spaced phases. Each delay element is characterized by a propagation delay that limits the digital resolution. Therefore the performance of the TDC depends on accuracy of the propagation delay of each delay element. In practice, the variations of the delay elements due to process variations results in TDC performance degradations.

BRIEF SUMMARY OF THE INVENTION

A detailed description is given in the following embodiments with reference to the accompanying drawings.

An embodiment of a time-to-digital converter is described, comprising a delay stage matrix and a measurement circuit. The delay stage matrix comprises a first and a second delay lines coupled thereto, and is arranged to propagate a transition signal from a starting delay stage in the first and a second delay lines, wherein each of the first and second delay lines comprises a same number of delay stages coupled in series, each delay stage in one of the first and second delay lines is coupled to a corresponding delay stage in the other delay line and operative to generate a delayed signal. The measurement circuit is arranged to determine a time of the transition signal propagating along the delay stages by sampling the delayed signals using a measurement signal to generate and hold a digital representation of the time.

Another embodiment of a time-to-digital converter is provided, comprising a delay stage matrix and a measurement circuit. The delay stage matrix comprises a plurality of delay stages arranged in a matrix formed by delay stage rows and delay stage columns, wherein each delay stage in a first row of the delay stage rows is inputted by two delay stages in two different delay stage columns with the two different delay stage columns being separated by a multiple of two-delay stage difference, each delay stage in a second row of the delay stage rows is inputted by two delay stages in a same delay stage column, each delay stage in the delay stage matrix is arranged to output a delayed signal. The measurement circuit is arranged to determine a time of a transition signal propagating along the delay stages by sampling the delayed signals using a measurement signal to generate a digital representation of the time.

BRIEF DESCRIPTION OF THE DROWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
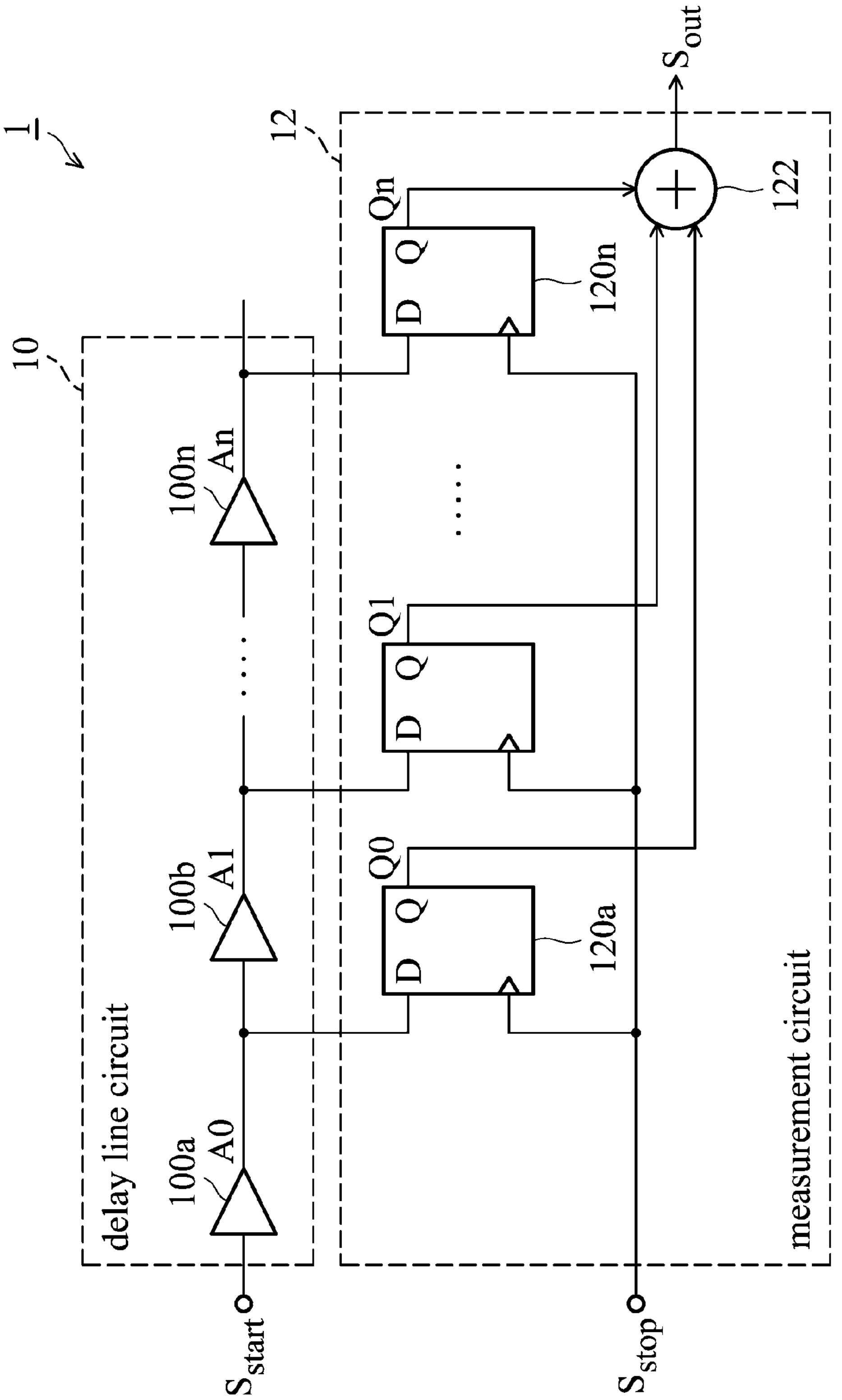
FIG. 1A is a block diagram of an exemplary time-to-digital converter (TDC) 1.

FIG. 1A is a block diagram of an exemplary time-to-digital converter (TDC) 1, comprising a delay chain 10 and a measurement circuit 12. Each delay stage is substantially identical to one another, having average internal delay $t_d$. In practice, the internal delay of each delay stage may differ from one another due to process variation. The delay chain 10 comprises a plurality of delay stages 100*a*, 100*b*, . . . , 100*n* connected in series. Correspondingly, the measurement circuit 12 comprises a plurality of flip-flops 120*a*, 120*b*, . . . , 120*n* and an adder 122. Only three delay stages and flip-flops are shown for clarity, more delay stages and flip-flops may be implemented for the TDC 1. The TDC 1 calculates a time that a start signal $S_{start}$ propagating along the delay chain 10 upon until a stop signal $S_{stop}$ is received.

Figure 1B:
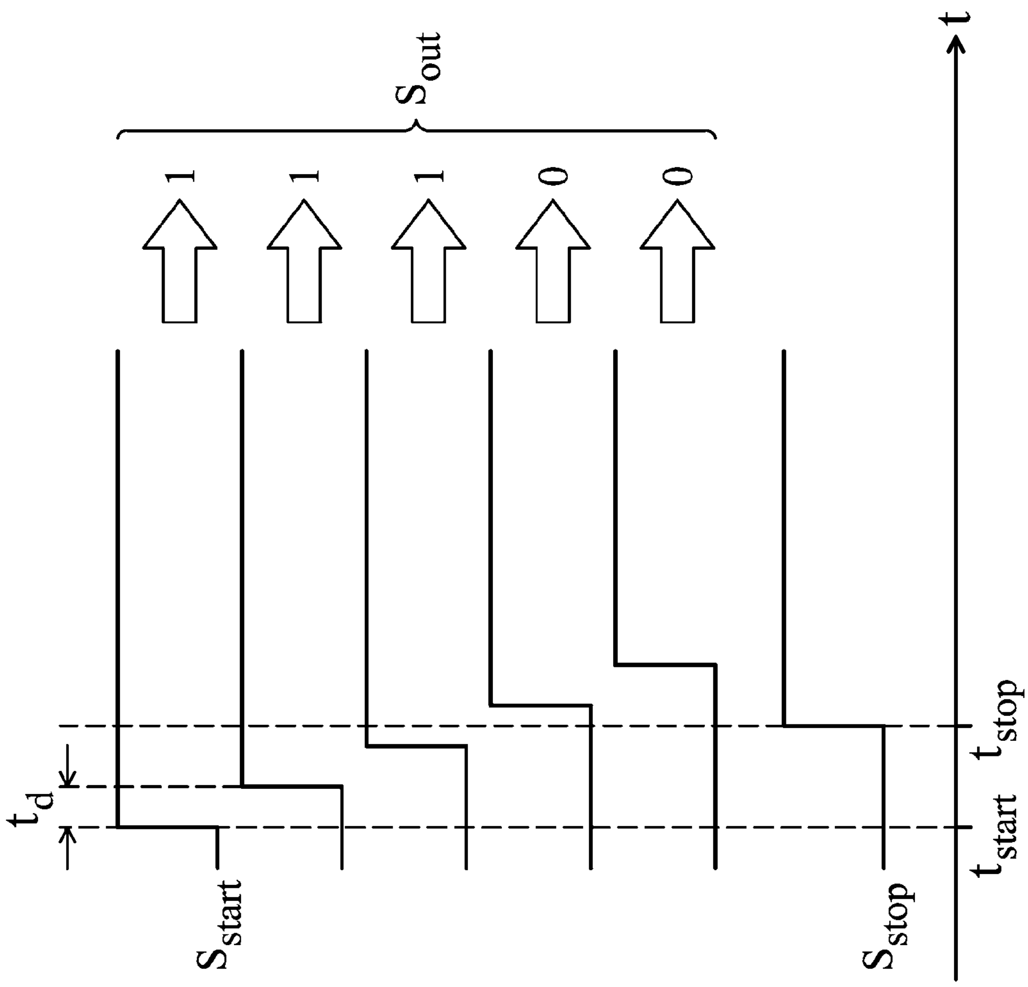
FIG. 1B shows a timing diagram illustrating operation of the TDC 1.

The operation of the TDC 1 comprises a propagation stage and a sampling stage. During the propagation stage, the transition signal $S_{start}$ ripples along the delay chain 10 that produces the delayed signal. The inputs of the flip-flops 120*a*, 120*b*, . . . , 120*n* are connected to the output of the delay stages 10*a*, 10*b*, . . . , 10*n* and sample the state of the delay-line on the rising edge of the stop signal $S_{stop}$. The adder 122 is connected to the outputs of all flip-flops to accumulate the results of sampled delayed signal and generate an output signal $S_{out}$ representing a propagation time of the transition signal $S_{start}$ along the delay chain 10. FIG. 1B shows a timing diagram illustrating operation of the TDC 1. The top 5 signals represent the sampled delayed outputs Q0 through Qn, with n being 5 in the embodiment. Upon start of a TDC cycle, the first delay stage propagates the transition signal $S_{start}$ along the delay chain 10 till the $3^{rd}$ delay stage. Then, the TDC 1 receives a stop signal $S_{stop}$ at time $t_{stop}$. In response to the stop signal $S_{stop}$, the measurement circuit 12 samples and holds the sampled delayed outputs Q0 through Q5, with the sampled outputs Q0 through Q3 being 1 and the sampled outputs Q4 and Q5 being 0. The adder 122 adds all sampled outputs together to produce an output signal $S_{out}$ representing the total propagation time in the delay chain circuit 10.

The output signal $S_{out}$ is a measure of a time difference between a rising edge of the transition signal $S_{start}$ occurring at a time $t_{start}$ and a rising edge of the stop signal $S_{stop}$ occurring at time $t_{stop}$, corresponding to a number of the delay stages that the transition signal $S_{start}$ has traveled through. Thus, the total propagation time can be determined by a product of the number of propagated delay stages and the average internal delay $t_d$. The resolution of the delay-line based TDC 1 is defined by the average internal delay $t_d$ of the delay stage. The delay stages 10*a*, 10*b*, . . . , 10*n* may be inverters or buffers. In some implementations, the time-to-digital converter is implemented by a gated ring delay line (not shown), referred to as a gated ring oscillator (GTO) TDC, comprising a CMOS inverter ring oscillator. The GTO TDC holds states of the delay stages during the delay sampling stage, and continues the next propagation from the states where the previous sampling stage ended.

Figure 2:
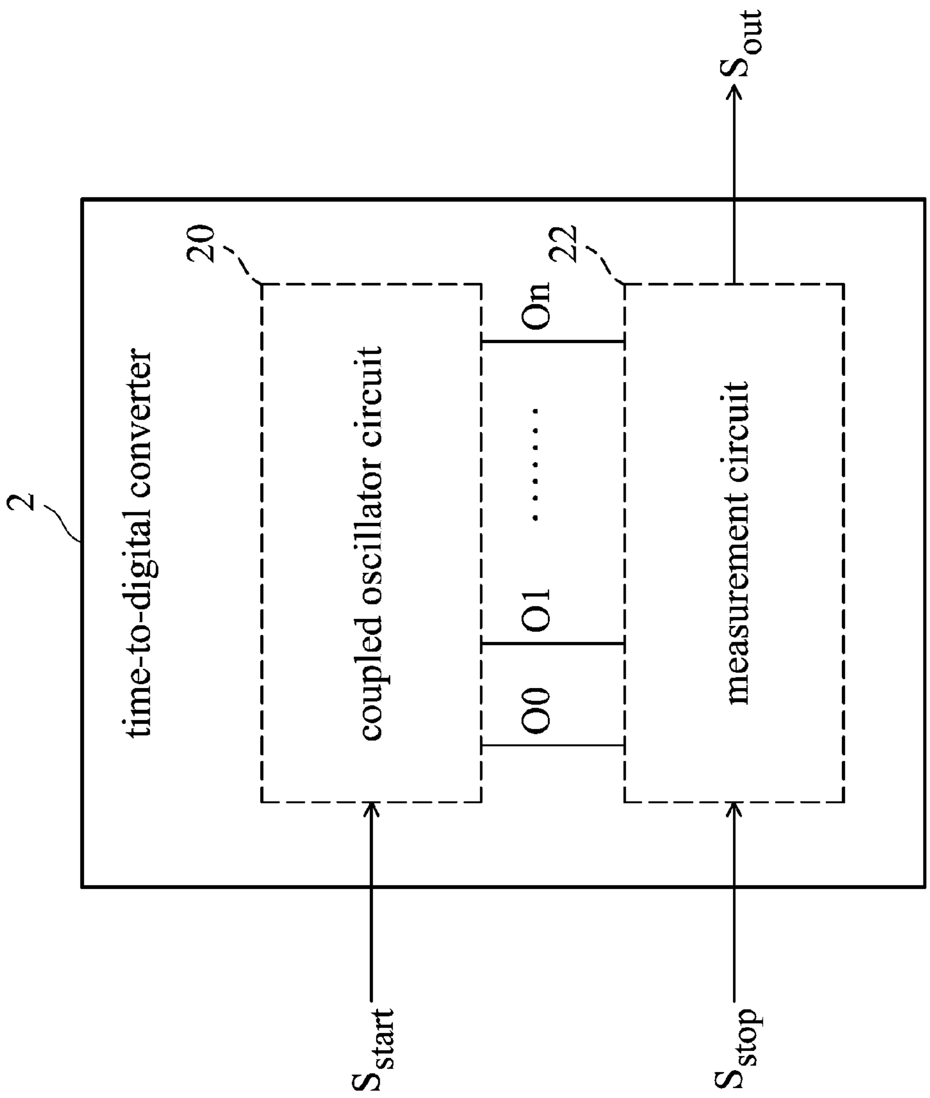
FIG. 2 is a block diagram of a time-to-digital converter 2 according to an embodiment of the invention.

FIG. 2 is a block diagram of a time-to-digital converter 2 according to an embodiment of the invention, utilizing a coupled oscillator structure to generate delays with a resolution equal to a fraction of an internal delay of a delay stage. The TDC 2 comprises a coupled oscillator 20 and a measurement circuit 22. Similar to TDC 1, the coupled oscillator 20 receives a transition signal $S_{start}$ as a first event to produce delay signals with a resolution equal to a stage delay of a delay stage divided by a number of rings. The coupled oscillator 20 comprises two or more delay lines (first and a second delay lines) coupled together, arranged to propagate the transition signal $S_{start}$ from a starting delay stage in the delay lines. The delay lines comprise a same number of delay stages coupled in series. Each delay stage of one delay line is coupled to a corresponding delay stage of the other delay line and operative to generate a delayed signal.

In some implementations, the coupled oscillator 20 may comprise first and second delay lines adjacent to each other. In the second delay line, each delay stage may be a dual-input inverter which receives a ring input from an immediately preceding delay stage in the first delay line and receives a coupling input from an adjacent preceding delay stage in the second delay line to generate the delayed signal. As to the delay stages of the second delay line, the immediately preceding delay stage and adjacent preceding delay stage correspond to a same column of the first and second delay lines. In the first delay line, each delay stage may be a dual-input inverter, which receives a ring input from an immediately preceding delay stage in the second delay line and receives a coupling input from an adjacent preceding delay stage in the first delay line to generate the delayed signal. However, as to the delay stages of the first delay line, the immediately preceding delay stage and the adjacent preceding delay stage correspond to two different columns of the first and second delay lines. For example, the column difference may be a multiple of two-delay stage difference.

Figure 3:
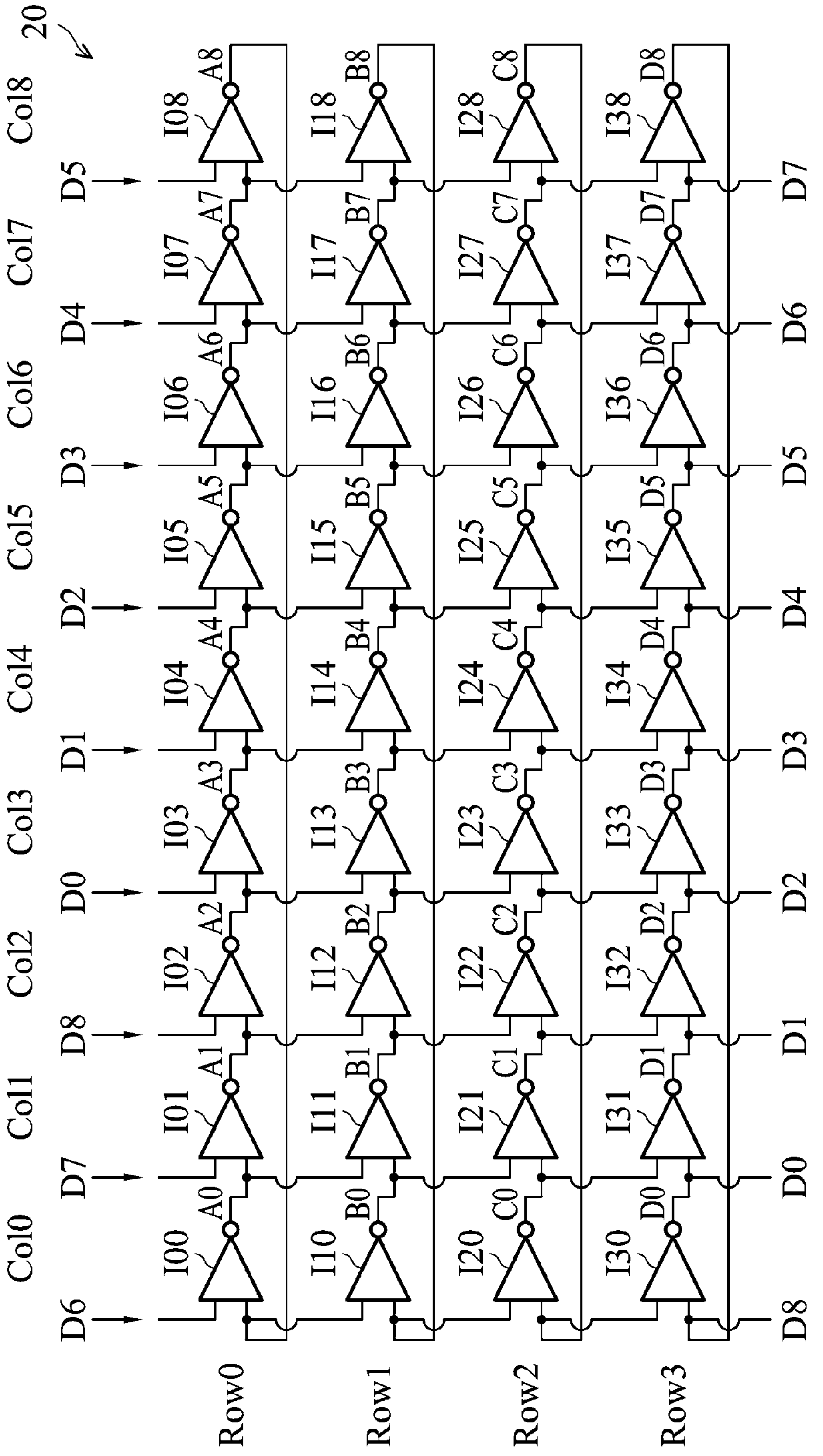
FIG. 3 is a block diagram of a coupled oscillator 20 according to an embodiment of the invention.

FIG. 3 shows an embodiment of a detailed circuit configuration of the coupled oscillator 20. The measurement circuit 22 samples all delayed signals O0, O1 through On outputted from the coupled oscillator 20 upon a signal edge of a stop signal $S_{stop}$ (measurement signal) as a second event, to produce an output signal $S_{out}$ representing a time difference between the first and second events. The measurement circuit 22 is arranged to determine a time of the transition signal $S_{start}$ propagating along the delay stages by sampling the delayed signals using the measurement signal $S_{stop}$ to generate and hold a digital representation $S_{out}$ of the time.

FIG. 3 is a block diagram of the coupled oscillator 20 incorporated in the TDC 2 in FIG. 2, comprising a matrix of delay stages, implemented by connecting several identical ring oscillators to function as a single unit (delay stage matrix), which comprises a plurality of delay stages arranged in a matrix formed by delay stage rows and delay stage columns. Each delay stage in a first row Row0 is inputted by two delay stages in two different delay stage columns separated by a multiple of two. For example, the delay stage I00 receives two inputs D6 and A8 from the delay stage I08 and I36 respectively, with the delay stage I08 and I36 being separated by 2 columns in the matrix. Each delay stage in a second row Row1, Row2, or Row3 is inputted by two delay stages in a same delay stage column. Each delay stage in the delay stage matrix is arranged to output a delayed signal. Adjacent pairs of ring oscillators are interconnected together through one or more coupling inputs. The coupling inputs allow each ring to affect one another such that they become interdependent, resulting in a phase lock relationship therebetween. All ring oscillators oscillate at a same frequency with a fixed phase relationship between the outputs. Specifically, the phase shift between the outputs in each set of outputs can be made a fraction of the stage delay, leading to a significant increase in delay resolution. In contrast to a ring oscillator using single input in each delay stage, the coupled ring oscillator needs two inputs in each inverter stage.

Figure 4:
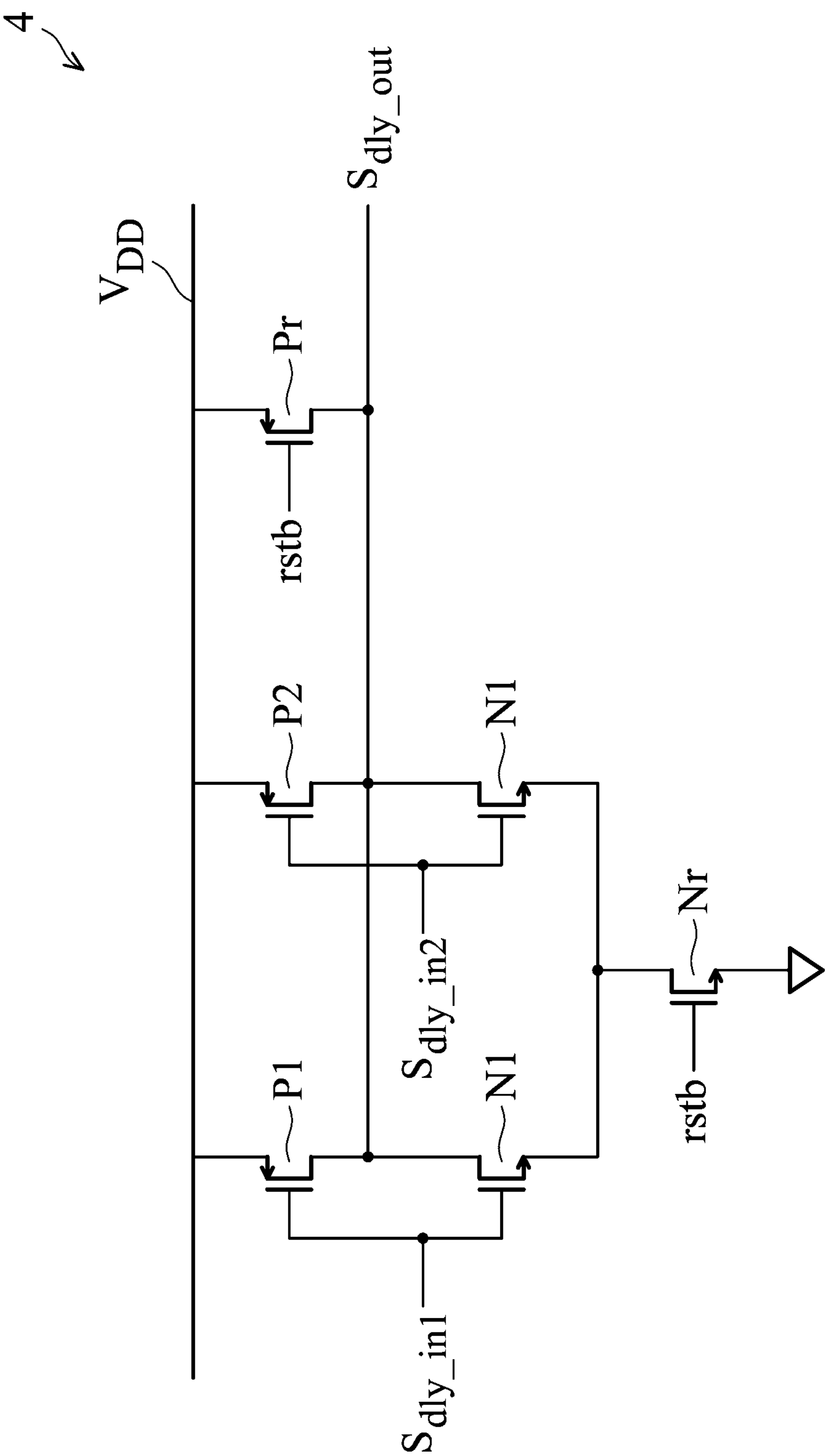
FIG. 4 depicts a circuit schematic of an exemplary dual-inputs delay stage 4 according to an embodiment of the invention.

The delay stages may be realized by a two-input inverter stage 4 to couple adjacent pairs of ring oscillators together, an embodiment thereof is shown in a circuit schematic in FIG. 4. The delay stage 4 comprises a first input $S_{dly\_in1}$ and a second input $S_{dly\_in2}$, one input thereof is connected to the output of a previous delay stage in the same ring, the other input is connected to an output of a previous delay stage in another ring. Accordingly, the former input is referred to as a ring input and the later input is referred to as a coupling input. Referring to FIG. 4, the dual-input delay stage 4 comprises two half-sized static CMOS inverter shunting the outputs thereof together. The delay between the ring and coupling input transition signals is small, and transition edges of the two input signals $S_{dly\_in1}$ and $S_{dly\_in2}$ overlap, both input signals affect the timing characteristics of the output transition signal $S_{dly\_out}$. The two-input inverter stage 4 comprises two reset transistors Pr and Nr enabling the output single $S_{dly\_out}$ to be restored to a default state. In some implementations, the default state may be 1.

Referring back to FIG. 3, by employment of the dual-input inverter stage, two or more ring oscillators can be connected together to form a two-dimensional delay stage matrix, which extends horizontally through the ring inputs and vertically through the coupling inputs. The top ring oscillator is connected to the bottom ring oscillator in a unique manner to provide a closed structure. The coupled ring oscillator forces two or more rings oscillating at the same frequency to be uniformly offset in phase by a precise fraction of the stage delay. With identical coupling between each adjacent pair of rings, the phase difference between each pair of outputs remains identical. The set of dual-input inverter stages along the vertical direction corresponding to all rings generates a set of delayed outputs (delayed signals) with a substantially same phase difference between any two outputs in the set of outputs. For examples, the nodes A0, B0, C0, and D0 form a set of outputs, with phases of adjacent outputs being separated by the substantially the same phase difference. The total phase shift across the set of delayed outputs from all rings can be constrained to equal to a multiple of two inverter delay. In the embodiment of FIG. 3, the phase shift step between consecutive two signals on the nodes A0, B0, C0, D0 and A2 are forced to be distributed uniformly over the multiple of the two inverter delay $t_d$, i.e., each phase shift step is $t_d/2$. Here $t_d$ is one inverter stage delay.

By closing connections between the top and bottom rings with a predetermined delay stage shift, the boundary constraint is imposed on the coupled oscillator 20, resulting in a fixed phase shift across all ring oscillators and a fixed phase difference between the ring and coupling inputs. When the fixed phase difference between the ring and coupling inputs of all delay stages, the propagation delays $t_d$ of all delay stages will be the same as no phase difference exists, since all delay stages experience an identical phase difference between the ring and coupling inputs. With the equal propagation delay $t_d$ for all delay stages, the oscillation frequency of all rings remains substantially the same. As a consequence, the phase difference between the ring and coupling inputs of all delay stages is invariant with time, leading to a stable state of the coupled oscillator structure. Closing the coupled oscillator circuit 20 with a non-zero delay stage shift forces a phase difference between the top and bottom nodes of the delay lines, thereby forcing the non-zero delay stage shift to be evenly distributed across all rings in the circuit 20. The non-zero delay stage shift is determined as a multiple of two stage delay $t_d$, with the multiple selected as 1 rendering smallest time resolution of the TDC 2.

When the top and bottom ring oscillators are connected by a delay stage shift of 2, the output phase of each top delay stage leads the output phase of the corresponding bottom delay stage. The phase difference is uniformly spun across all corresponding ring nodes and can be computed by dividing the total delay stage difference 2 $t_d$ by the total number of the rings M. The uniformly distributed phase shift in the set of delayed outputs renders decreased time resolution less than the propagation delay $t_d$ of the delay stage. As the number of the coupled ring oscillators M increases, the time resolution of the delayed outputs decreases accordingly. Specifically, the phase shift step between any pair of delayed outputs in adjacent rings is proportional to the multiple k of 2 delay stage delay $t_d$, and inversely proportional to the number of the rings M. In other words, the phase shift step can be represented by $2*k*t_d/M$, with k being selected as 1 and M as 4 in the embodiment, rendering the $t_d/2$ of the phase difference between the delayed outputs of delay stages in the adjacent rows. The phase relationship is maintained by the coupled circuit structure without a need for a calibration, i.e., the phase shift relationship of the set of delayed outputs is generated by the coupled array structure, regardless of the process, temperature, or voltage variation.

FIG. 3 illustrates an exemplary two-dimensional delay stage matrix comprising a plurality of delay stages arranged in 4 delay stage rows and 9 delay stage columns. Each delay stage row represents a ring oscillator. Each delay stage column comprises the set of delay stages that share cross-coupled inputs. Each delay stage receives the ring input from an immediately preceding delay stage in the same ring (row) and the coupling input from an adjacent delay stage in another ring (row). Each delay stage in a first row Row0 receives the outputs of the immediately preceding delay stage and the adjacent receding delay stage (two delay stages) in two different delay stage columns separated by a multiple of two-delay stage difference, whereas each delay stage in the other rows Row1, Row2, and Row3 receives the outputs of the immediately preceding delay stage and the adjacent preceding delay stage from the same delay stage column. Take an example in FIG. 3, the delay stages in the first (top) row Row0 receives coupling inputs from the fourth (bottom) row Row3 by a delay stage shift of 2. For examples, instead of receiving the coupling input from the delay stage I38, the first delay stage I00 receives the coupling input D6 from the delay stage I36, or a delay stage shift of 2, the rest delay stages in the first Row 0 follows the same connection order. As 4 ring oscillators are used in the embodiment, the phase difference is uniformly distributed among the 4 rings, resulting in a phase shift of a half stage delay $t_d$ between any pair of delay stages in adjacent rows. For examples, the delayed outputs of the delay stage I00 and the delay stage I10 have a phase difference of half $t_d$ therebetween, so do the delayed outputs of the delay stage I10 and the delay stage I20. Since the phase difference of the delayed outputs between delay stages in adjacent rows is decreased to the half stage delay $t_d$, the time resolution of the delayed outputs is also reduced. Specifically, the phase difference increases with the number of the delay stage shift of the connection between the top and bottom rows, and decreases with the number of the coupled oscillators. Because the coupled oscillator configuration provides increased phase-shifted outputs, a pair of differential outputs can be obtained among the increased phase-shifted outputs. When a number of the delay stage rows is even, the coupled oscillator circuit 20 (delay stage matrix) is capable of outputting a differential delayed signal which is being out-of-phase to the outputted delayed signal. For examples, the number of the delay stage rows of the illustrated embodiment is 4 (even number), the delayed output C0 of the I20 has a delay of 1 $t_d$ and is in-phase with respect to the delayed output A0 of the delay stage I00, the delayed output of the I01 also has a delay of 1 $t_d$ and is out-of-phase with respect to the delayed output A0 of the delay stage I00, rending an out-of-phase relationship between the delayed outputs of the delay stages I01 and I20 at a reference time of 1 $t_d$ from the delayed output A0. Accordingly, the delayed outputs I01 and I20 are 180° out-of-phase and are differential to each other.

Although the coupled oscillator 20 is illustrated as a single-end signal circuit, people having ordinary skill in the art will readily recognize a differential circuit may be implemented in place of the single-end signal circuit with appropriate modification, and without deviating from the principle of the invention. Also, despite the coupled oscillator 20 uses the ring structure (a closed-loop) in the delay chains, an open-loop circuit or a delay chain configuration may be implemented without looping back the last delayed signal to the first delay stage, appropriate circuit should be implemented to supply the ring input to the first delay stage of each delay chain.

The coupled oscillator based TDC 2 reduces time resolution of the TDC measurement by increasing the number of coupled ring oscillators, providing increased circuit performance.

Figure 5:
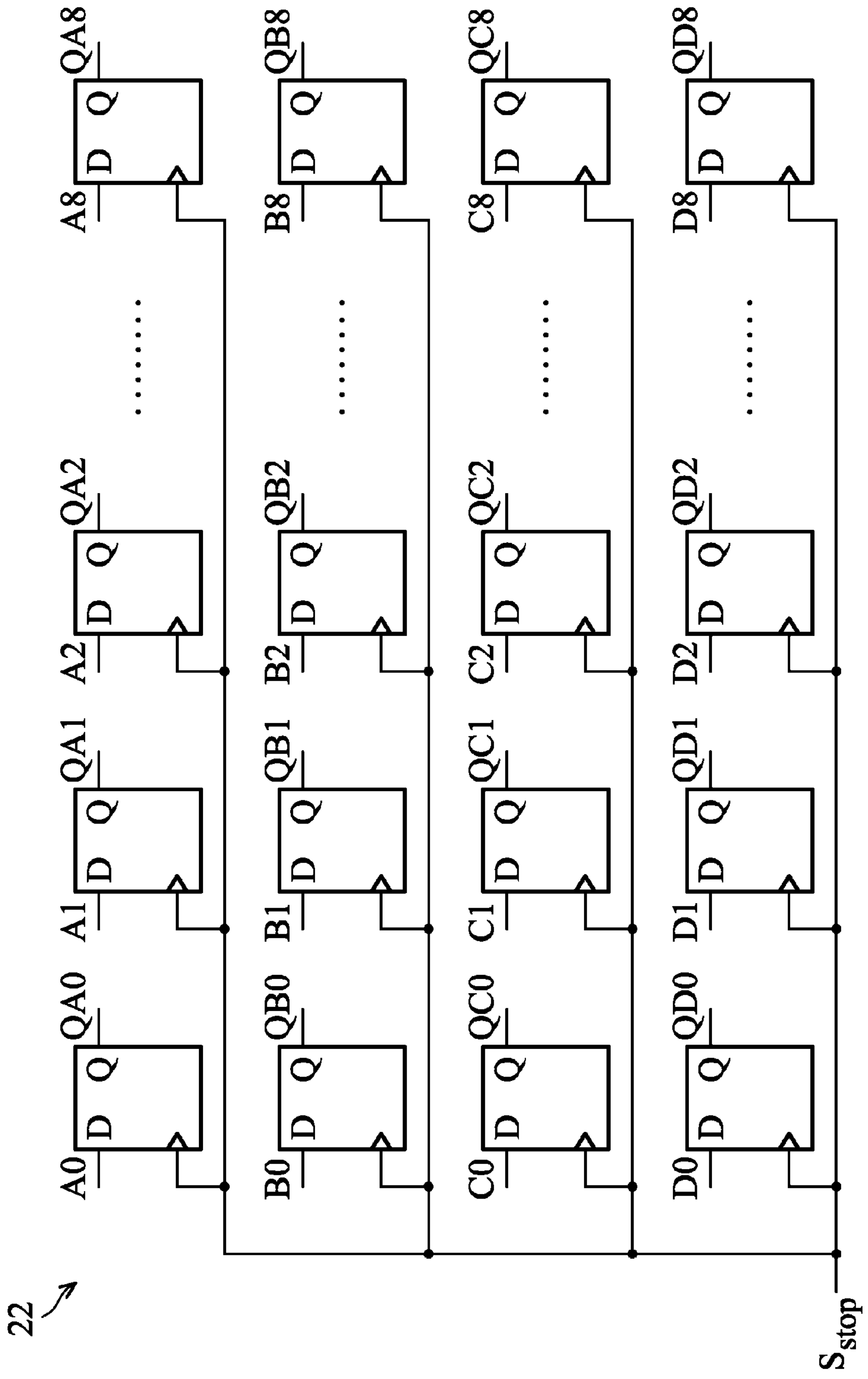
FIG. 5 is a block diagram of a measurement circuit 22 according to an embodiment of the invention.

FIG. 5 is a block diagram of a measurement circuit 22 according to an embodiment of the invention, comprising a register matrix corresponding to the delay stage matrix. The register matrix comprises flip-flops F00 through F08, F10 through F18, F20 through F28, and F30 through F38, clocking in the corresponding delay stage outputs on a rising or falling edge of the stop signal $S_{stop}$. With reference to the coupled oscillator in FIG. 3, the flip-flops F00 through F08 corresponds to the inverters I00 through I08 and receives the output signals A0 through A8 respectively. Likewise, the flip-flops F10 through F18 corresponds to the inverters I10 through I18, the flip-flops F20 through F28 corresponds to the inverters I20 through I28, and the flip-flops F30 through F38 corresponds to the inverters I30 through I38. Upon reception of the stop signal $S_{stop}$, the flip-flop matrix samples and holds output values of the corresponding inverter stages. The sampled output values are then sent to an adding or combining circuit (not shown) to produce the output signal $S_{out}$ (not shown) as the digital representation of the time measurement.

Figure 6:
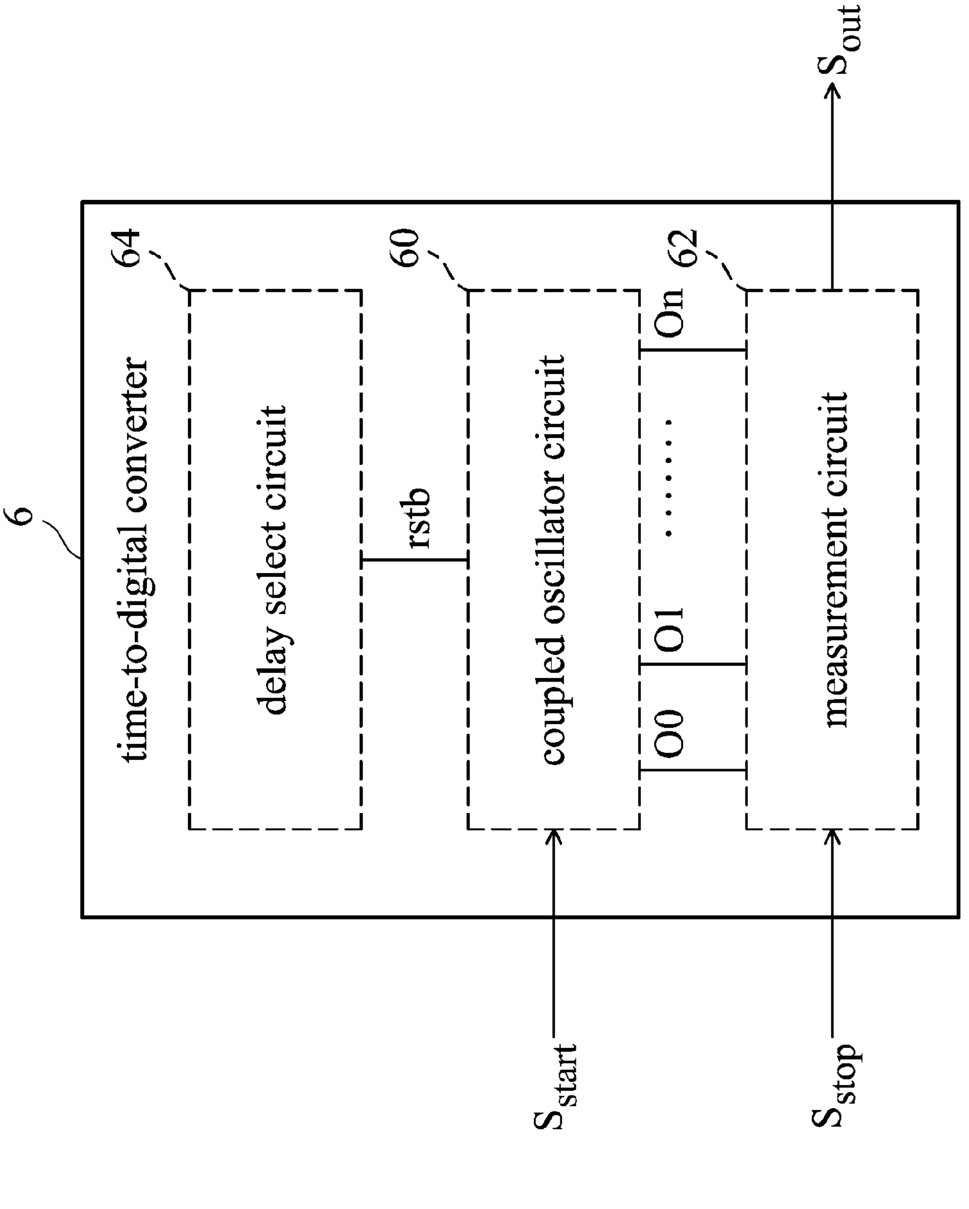
FIG. 6 is a block diagram of a time-to-digital converter 6 according to another embodiment of the invention.

FIG. 6 is a block diagram of a time-to-digital converter 6 according to another embodiment of the invention, comprising a coupled oscillator 60, a measurement circuit 62, and a delay select circuit 64. The delay select circuit 64 is coupled to the coupled oscillator 60, then subsequently to the measurement circuit 62. The configuration and operation of the coupled oscillator 60 and measurement circuit 62 is identical to the coupled oscillator 20 and measurement circuit 22 in FIG. 2. Relevant explanation for the coupled oscillator 20 and measurement circuit 22 can find reference in the preceding paragraphs and will not be repeated here for brevity.

Because the coupled oscillator 60 employs a number of delay stage elements, any device mismatch in the coupled oscillator 60 produces variation in the stage delay, leading to unwanted TDC nonlinearity including differential nonlinearity (DNL) and integrated nonlinearity (INL). The TDC nonlinearity produces fractional spurs in a fractional phase locked loop (PLL) applications and injects out-of-band phase noise into a low-frequency signal, which further transforms into higher in-band phase noise. The delay select circuit 64 deploys a dynamic element matching (DEM) technique to reduce or remove the nonlinearity due to the device mismatch. The dynamic element matching technique refers to dynamically interchange mismatched element in the circuit, and take an average of the outputs, thereby averaging out device mismatch and eliminate the fractional spurs.

The delay select circuit 64 may employ various DEM algorithms such as random DEM, data weighted averaging DEM, other DEM algorithms, or a combination thereof to actively determine and select a starting delay stage from all delay stages in the coupled oscillator 60. Upon determination of the starting delay stage, the delay select circuit 64 controls the propagation of the transition signal $S_{start}$ originates from the selected starting stage. In some implementations, the delay select circuit 64 controls the transition signal origination by resetting the selected starting stage. In the implementation of the dual-input delay stage 3 in FIG. 3, the delay select circuit 64 resets the starting stage by applying the reset signal rstb to transistor Pr and Nr for a predetermined reset period. As a result, the starting stage reset by the reset signal rstb restores the output thereof to the default state and ripples the reset value along the cross-coupled oscillator chain. The predetermined reset period is selected such that all delay stages in the coupled oscillator 60 can be reset. Eventually the entire coupled oscillator is reset in the predetermined reset period. As soon as the delay select circuit 64 releases the reset signal rstb from the starting stage, a transition signal $S_{start}$ propagates therefrom, thereby initiating another round of time-to-digital measurement from the selected starting stage. The reset operation is carried during the sample and hold period of delayed outputs, i.e., when the coupled oscillator circuit 60 is disabled for signal propagation and the measurement circuits is enabled for signal sampling and holding.

In some implementations, the delay select circuit 64 selects the starting delay stage based on the random DEM algorithm. The delay select circuit 64 randomly selects one delay stage out of all in the coupled oscillator 60 according to a pseudo random code stored in a memory module (not shown).

Figure 7:
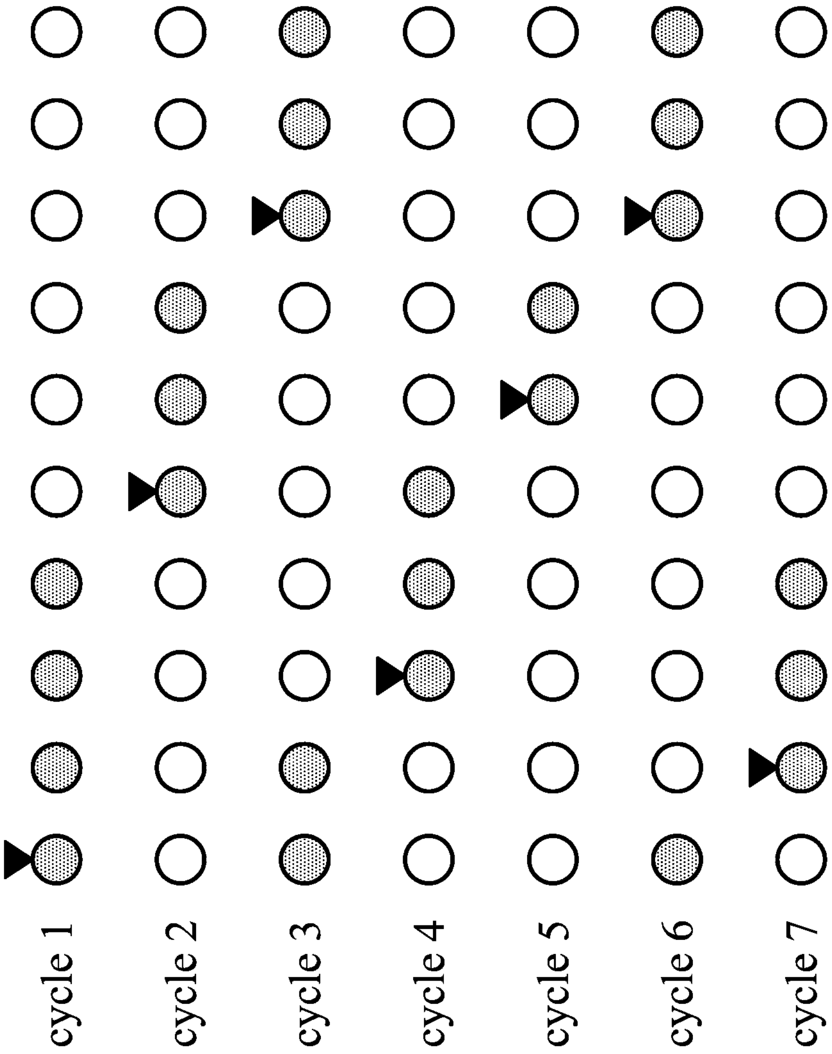
FIG. 7 illustrates of a dynamic element matching scheme according to another embodiment of the invention.

In other implementations, the delay select circuit 64 selects the starting delay stage based on the data weighted averaging DEM algorithm, by which the starting stage is selected as the successive delay stage from where the previous TDC cycle was completed. FIG. 7 illustrates of a data weighted averaging dynamic element matching scheme according to an embodiment of the invention. The TDC in FIG. 7 employs 10 delay stages for the time measurement. In the first TDC cycle, the first 4 delay stages are used, thus the delay select circuit 64 determines the $5^{th}$ delay stage as the next starting stage. In the second TDC cycle, the signal propagation is originated from the fifth delay stage passing through 3 delay stages till the $7^{th}$ delay stage. Hence the delay select circuit 64 determines the $8^{th}$ delay stage as the next starting stage. During the third TDC cycle, the transition signal begins from the $8^{th}$ delay stage, propagates through the end and turns around to the beginning of the delay chain till the $2^{nd}$ delay stage, then the time measurement is taken. Accordingly, the delay select circuit 64 determines the $3^{rd}$ delay stage as the next starting stage for the fourth TDC cycle, and so on and so forth.

By incorporation of the DEM algorithms, the TDC 6 uses all delay stages in the coupled oscillator 60 uniformly, thereby reducing effects of device mismatch in the delay stages, decreasing in-band phase noises, and increasing TDC linearity.

As used herein, the term "determining" encompasses calculating, computing, processing, deriving, investigating, looking up (e.g., looking up in a table, a database or another data structure), ascertaining and the like. Also, "determining" may include resolving, selecting, choosing, establishing and the like.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine.

The operations and functions of the various logical blocks, modules, and circuits described herein may be implemented in circuit hardware or embedded software codes that can be accessed and executed by a processor.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A time-to-digital converter, comprising:

a coupled oscillator comprising a first and a second delay lines coupled thereto, arranged to propagate a transition signal from a starting delay stage in the first and a second delay lines, wherein each of the first and second delay lines comprises a same number of delay stages coupled in series, each delay stage in one of the first and second delay lines is coupled to a corresponding delay stage in the other delay line and operative to generate a delayed signal; and a measurement circuit, arranged to determine a time of the transition signal propagating along the delay stages by sampling the delayed signals using a measurement signal to generate and hold a digital representation of the time.

2. The time-to-digital converter of claim 1, further comprising a delay select circuit, arranged to select the starting delay stage from all delay stages.

3. The time-to-digital converter of claim 1, wherein each delay stage in the second delay line is a dual-input inverter, receiving a ring input from an immediately preceding delay stage in the first delay line and receiving a coupling input from an adjacent preceding delay stage in the first delay line to generate the delayed signal, wherein the immediately preceding delay stage and adjacent preceding delay stage correspond to a same column of the first and second delay lines.

4. The time-to-digital converter of claim 1, wherein each delay stage in the first delay line is a dual-input inverter, receiving a ring input from an immediately preceding delay stage in the first delay line and a coupling input from an adjacent preceding delay stage in the second delay line to generate the delayed signal, wherein the immediately preceding delay stage and the adjacent preceding delay stage correspond to two different columns of the first and second delay lines, and a column difference between the two different columns is a multiple of two-delay stage difference.

5. The time-to-digital converter of claim 1, wherein a time resolution of the digital representation is less than a propagation delay of the delay stage.

6. The time-to-digital converter of claim 1, wherein a time resolution of the digital representation increases with a number of the delay lines in the coupled oscillator.

7. The time-to-digital converter of claim 2, wherein the delay select circuit is arranged to select the starting delay stage from all delay stages by resetting the starting delay stage.

8. The time-to-digital converter of claim 2, wherein each delay stage has a delay variation operable to generate the delayed signal, and the delay select circuit is arranged to dynamically interchange the delay stages to reduce an effect of the delay variations on the digital representation of the time.

9. The time-to-digital converter of claim 2, wherein the delay select circuit is arranged to randomly select the starting delay stage from all delay stages.

10. The time-to-digital converter of claim 2, wherein the delay select circuit is arranged to select the starting delay stage based on a last propagated delay stage in the last determination of the digital representation of the time.

11. A time-to-digital converter, comprising:

a delay stage matrix, comprising a plurality of delay stages arranged in a matrix formed by delay stage rows and delay stage columns, wherein each delay stage in a first row of the delay stage rows is inputted by two delay stages in two different delay stage columns with the two different delay stage columns being separated by a multiple of two-delay stage difference, each delay stage in a second row of the delay stage rows is inputted by two delay stages in a same delay stage column, each delay stage in the delay stage matrix is arranged to output a delayed signal; and a measurement circuit, arranged to determine a time of a transition signal propagating along the delay stages by sampling the delayed signals using a measurement signal to generate a digital representation of the time.

12. The time-to-digital converter of claim 11, wherein the transition signal is propagated from a starting delay stage, and the time-to-digital converter further comprises a delay select circuit, arranged to select the starting delay stage from all delay stages.

13. The time-to-digital converter of claim 11, wherein the delay stage is a dual-input inverter.

14. The time-to-digital converter of claim 11, wherein when a number of the delay stage rows is even, the delay stage matrix is arranged to output a differential delayed signal which is being out-of-phase to the outputted delayed signal.

15. The time-to-digital converter of claim 11, wherein a time resolution of the digital representation is less than a propagation delay of the delay stage.

16. The time-to-digital converter of claim 11, wherein a time resolution of the digital representation increases with a number of the delay stage rows.

17. The time-to-digital converter of claim 12, wherein each delay stage has a delay variation operable to generate the delayed signal, and the delay select circuit is arranged to dynamically interchange the delay stages to reduce an effect of the delay variations on the digital representation of the time.

18. The time-to-digital converter of claim 12, wherein the delay stage matrix is arranged to select the starting delay stage from all delay stages by resetting the starting delay stage.

19. The time-to-digital converter of claim 12, wherein the delay select circuit is arranged to randomly select the starting delay stage from all delay stages.

20. The time-to-digital converter of claim 12, wherein the delay select circuit is arranged to select the starting delay stage based on a last propagated delay stage in the last determination of the digital representation of the time.

* * * * *